(12) United States Patent
Kraus et al.

(10) Patent No.: US 7,473,637 B2
(45) Date of Patent: Jan. 6, 2009

(54) ALD FORMED TITANIUM NITRIDE FILMS

(75) Inventors: Brenda D Kraus, Boise, ID (US); Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 148 days.

(21) Appl. No.: 11/185,423

(22) Filed: Jul. 20, 2005

(65) Prior Publication Data

US 2007/0020923 A1    Jan. 25, 2007

(51) Int. Cl.
*H01L 21/4763* (2006.01)
(52) U.S. Cl. .................. 438/627; 438/794; 438/643; 438/653; 427/96.8; 427/97.2; 257/915; 257/E21.168
(58) Field of Classification Search ............ 438/794, 438/627, 643, 653; 427/96.8, 97.2; 257/915, 257/E21.168
See application file for complete search history.

(56) References Cited

U.S. PATENT DOCUMENTS

| | | | |
|---|---|---|---|
| 5,192,589 A | 3/1993 | Sandhu | |
| 5,246,881 A | 9/1993 | Sandhu et al. | |
| 5,399,379 A | 3/1995 | Sandhu | |
| 5,659,057 A | 8/1997 | Vaartstra | |
| 5,747,116 A | 5/1998 | Sharan et al. | |
| 5,866,205 A | 2/1999 | Vaartstra et al. | |
| 5,901,271 A * | 5/1999 | Benzing et al. | 392/387 |
| 5,990,559 A | 11/1999 | Marsh | |
| 6,081,034 A | 6/2000 | Sandhu et al. | |
| 6,200,893 B1 | 3/2001 | Sneh | |
| 6,218,293 B1 | 4/2001 | Kraus et al. | |
| 6,291,340 B1 | 9/2001 | Sandhu et al. | |
| 6,338,880 B1 | 1/2002 | Akram | |
| 6,365,519 B2 | 4/2002 | Kraus et al. | |
| 6,445,023 B1 | 9/2002 | Vaartstra et al. | |
| 6,485,988 B2 | 11/2002 | Ma et al. | |
| 6,531,192 B2 | 3/2003 | Akram | |
| 6,548,405 B2 | 4/2003 | Kraus et al. | |
| 6,603,328 B2 | 8/2003 | Takahashi et al. | |
| 6,617,634 B2 | 9/2003 | Marsh et al. | |

(Continued)

OTHER PUBLICATIONS

"Atomic Layer Deposition of CMOS Gates With Variable Work Functions", U.S. Appl. No. 10/754,842, filed Jan. 9, 2004.

(Continued)

*Primary Examiner*—George Fourson
*Assistant Examiner*—John M Parker
(74) *Attorney, Agent, or Firm*—Schwegman, Lundberg & Woessner, P.A.

(57) ABSTRACT

The use of atomic layer deposition (ALD) to form a conductive titanium nitride layer produces a reliable structure for use in a variety of electronic devices. The structure is formed by depositing titanium nitride by atomic layer deposition onto a substrate surface using a titanium-containing precursor chemical such as TDEAT, followed by a mixture of ammonia and carbon monoxide or carbon monoxide alone, and repeating to form a sequentially deposited TiN structure. Such a TiN layer may be used as a diffusion barrier underneath another conductor such as aluminum or copper, or as an electromigration preventing layer on top of an aluminum conductor. ALD deposited TiN layers have low resistivity, smooth topology, high deposition rates, and excellent step coverage and electrical continuity.

45 Claims, 4 Drawing Sheets

U.S. PATENT DOCUMENTS

| | | |
|---|---|---|
| 6,624,517 B1 | 9/2003 | Sandhu |
| 6,630,391 B2 | 10/2003 | Agarwal et al. |
| 6,630,718 B1 | 10/2003 | Trivedi |
| 6,632,736 B2 | 10/2003 | Sandhu et al. |
| 6,635,939 B2 | 10/2003 | Agarwal et al. |
| 6,737,317 B2 | 5/2004 | Marsh et al. |
| 6,812,139 B2 | 11/2004 | Givens et al. |
| 6,830,983 B2 | 12/2004 | Marsh |
| 6,849,298 B2 * | 2/2005 | Pyo ............................. 427/250 |
| 6,881,667 B2 | 4/2005 | Sandhu et al. |
| 6,908,849 B2 | 6/2005 | Derraa |
| 6,911,381 B2 | 6/2005 | Agarwal et al. |
| 6,953,743 B2 | 10/2005 | Sandhu et al. |
| 2001/0014521 A1 | 8/2001 | Kraus et al. |
| 2001/0050039 A1 | 12/2001 | Park |
| 2002/0001906 A1 | 1/2002 | Park |
| 2002/0106896 A1 | 8/2002 | Kraus et al. |
| 2002/0195683 A1 | 12/2002 | Kim et al. |
| 2003/0198587 A1 * | 10/2003 | Kaloyeros et al. ........... 423/409 |
| 2004/0023810 A1 * | 2/2004 | Ignatiev et al. .............. 505/100 |
| 2005/0042373 A1 | 2/2005 | Kraus et al. |
| 2007/0004186 A1 * | 1/2007 | Yoshii et al. ................. 438/584 |
| 2007/0065594 A1 * | 3/2007 | Chiang et al. ................ 427/533 |
| 2007/0116887 A1 * | 5/2007 | Faguet ......................... 427/569 |
| 2007/0200243 A1 | 8/2007 | Kraus et al. |

OTHER PUBLICATIONS

"Conductive Nanoparticles", U.S. Appl. No. 11/197,184, filed Aug. 4, 2005.

"Enhanced Atomic Layer Deposition", U.S. Appl. No. 10/229,338, filed Aug. 26, 2002.

"Method of Making an Oxygen Diffusion Barrier for Semiconductor Devices", U.S. Appl. No. 10/230,605, filed Aug. 29, 2002.

Ahn, Kie Y., "Iridium / Zirconium Oxide Structure", U.S. Appl. No. 11/152,759, filed Jun. 14, 2005.

Ahn, Kie Y., "Ruthenium Gate for a Lanthanide Oxide Dielectric Layer", U.S. Appl. No. 10/926,812, filed Aug. 26, 2004.

Claflin, B., et al., "Investigation of the growth and chemical stability of composite metal gates on ultra-thin gate dielectrics", *Silicon Front-End Technology—Materials Processing and Modelling. Symposium. Mater. Res. Soc.*, (1998), 171-176.

Forbes, Leonard, et al., "Metal-Substituted Transistor Gates", U.S. Appl. No. 11/176,738, filed Jul. 7, 2005.

Gordon, Roy G., "New Precursors for Atomic Layer Deposition (ALD) of Metals and Diffusion Barriers", *American Vac. Soc. Conference*, San Jose, CA,(Aug. 4, 2003),42 pages.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings vol. 672)*, (2001), 7.8.1-7.8.6.

Koo, J, "Study on the characteristics of TiAlN thin film deposited by atomic layer deposition method", *Journal of Vacuum Science & Technology A-Vacuum Surfaces & Films*, 19(6), (Nov. 2001),2831-4.

Kukli, Kaupo, "Atomic Layer Deposition of Titanium Oxide from TiI4 and H2O2", *Chemical Vapor Deposition*, 6(6), (2000),303-310.

Lee, Dong H., et al., "Metalorganic chemical vapor deposition of TiO2:N anatase thin film on Si substrate", *Appl. Phys. Lett.*, 66(7), (Feb. 1995),815-816.

Min, Jae-Sik, et al., "Atomic layer deposition of TiN films by alternate supply of tetrakis (ethylmethylamino)-titanium and ammonia", *Japanese Journal of Applied Physics Part 1-Regular Papers Short Notes & Review Papers*, 37(9A), (Sep. 1998),4999-5004.

Sneh, Ofer, "Thin film atomic layer deposition equipment for semiconductor processing", *Thin Solid Films*, 402, (2002),248-261.

"Written Opinion and International Search Report for International Appln. No. PCT/US2006/028041", 6 pgs.

"U.S. Appl. No. 10/225,605 Partial Prosecution History", (as of Oct. 23, 2007),474 pgs.

"U.S. Appl. No. 10/229,338 Partial Prosecution History", (as of Oct. 28, 2007),88 pgs.

"U.S. Appl. No. 10/230,605 Partial Prosecution History", (as of Oct. 28, 2007),116 pgs.

U.S. Appl. No. 10/754,842 Partial Prosecution History (as of Oct. 25, 2007),219 pgs.

U.S. Appl. No. 11/038,730 Partial Prosecution History (as of Oct. 25, 2007),93 pgs.

\* cited by examiner

ALD FORMED TITANIUM NITRIDE FILMS

TECHNICAL FIELD

This application relates generally to semiconductor devices and device fabrication and, more particularly, to conductive layers and their method of fabrication.

BACKGROUND

The semiconductor device industry has a market driven need to reduce the size of devices such as transistors, capacitors and electrically conductive interconnects. Smaller transistors result in improved operational speed and clock rate, and reduced power requirements in both the standby and operational modes. Smaller devices also need thinner dielectric layers, thinner diffusion layers and thinner conductive interconnect layers. Thinner conductor layers may result in what are known as step coverage issues when the thin conductor lines traverse a steep contact step or edge. These steps or edges are becoming increasingly deep and narrow. The contact edges may be substantially deeper than the diameter of the contact hole, a situation known as a high aspect ratio contact hole, which may also cause step coverage and contact filling issues. Thinner layers may also be more sensitive to intermingling or diffusion of the different materials into regions where they may cause potential reliability problems. The increasingly small and reliable integrated circuits (ICs) will likely be used in products such as processor chips, mobile telephones, and memory devices such as dynamic random access memories (DRAMs). One known method of improving conductor reliability is the use of a layer of conductive titanium nitride (TiN) under, or over, other conductors, such as aluminum or copper in order to prevent the metal from diffusing into surrounding insulator layers. The deposition of TiN by means of chemical vapor deposition (CVD) or physical vapor deposition (PVD) methods such as sputtering, often results in layers with poor conductivity with CVD, usually expressed in terms of resistivity in units of ohm-cm, or in μohm-cm, or in poor conformality with PVD resulting in incomplete coverage.

SUMMARY

The abovementioned issues are addressed by the present invention and will be understood by reading and studying the following specification.

The structure may be formed by depositing titanium by atomic layer deposition (ALD) onto a substrate surface using precursor chemicals to form a film of TiN, or some other titanium nitride, $TiN_x$, where the film has a very specific and repeatable thickness. This process may be known as an ALD cycle. The desired final thickness is obtained by knowing the TiN film thickness for one ALD cycle and repeating as often as necessary to form a film of the required thickness.

A layer of titanium nitride formed by the ALD method may be very conductive (i.e., low resistivity), for example 600 micro ohm-centimeter (μohm-cm), as compared to 6000 μohm-cm for titanium nitride films formed by previous methods such as chemical vapor deposition (CVD) using TDMAT (tetrakis dimethyl amido titanium) and ammonia.

An embodiment of a method for forming a titanium nitride layer having a first thickness on a substrate by atomic layer deposition (ALD) includes exposing the substrate to at least one precursor containing titanium, then exposing the substrate to at least one reactant containing nitrogen and at least one reactant containing no nitrogen. Reactant is a term applied to ALD precursors that follow an initial precursor in a deposition cycle, and is only used to help distinguish the materials used in the ALD reaction. The temperature of the ALD is in a range of approximately 200° C. to 370° C., and preferably approximately 230° C. The titanium precursor may be tetrakisdiethylamidotitanium (TDEAT), and the precursor may be a liquid having a temperature between 55° C. and 115° C., preferably 75° C. The liquid may be transported to the ALD reactor by an inert carrier gas, preferably helium, having a flow of from 50 sccm to 150 sccm.

The reactants may include reducing agents, and are preferably a mix of ammonia ($NH_3$) and carbon monoxide (CO), having a typical ratio of about 1 part ammonia to 7 parts carbon monoxide. The reactants may also be used sequentially rather than simultaneously, or in alternate ALD cycles.

ALD reactions typically result in one layer of TiN per ALD reaction cycle, with a thickness per cycle typically about one Ångstrom. The cycle is repeated to form a titanium nitride film having a final thickness.

ALD reactions may have non-reactive purge gases between each precursor or reactant flow. In general, there is no substantial difference between precursors and reactants, and the terms are used herein only to indicate the order of use in a single deposition cycle. A method of forming a titanium nitride layer on a substrate by atomic layer deposition (ALD) may include exposing the substrate to at least one precursor chemical containing titanium, exposing the substrate to a non-reactive purge gas flow, exposing the substrate to a mixture having at least one reactant gas containing nitrogen, exposing the substrate to a third non-reactive purge gas flow, and repeating the cycle until the desired final thickness is achieved. A non-reactive purge gas flow may be present before the beginning of the cycle, or at any time during the cycle.

The titanium nitride layers formed by the ALD process may have a chemical formula of $TiN_x$, where $0.5<X<2.0$, but preferably $X=1$. The TiN layers have low resistivity as compared to CVD and sputtering methods, and may be less than 800 μohm-cm. The TiN layers have excellent step coverage even over contact steps with high aspect ratios, and may have greater than 75% step coverage.

The TiN layers provided by this method may be used with a conductive layer (for example aluminum) below the titanium nitride layer, or above the titanium nitride layer. The TiN layers may be useful as diffusion barriers, for electromigration control, or to provide reliable parallel current paths. Such TiN layers may be useful in the formation of conductive plates on a capacitive device, or conductive signal lines on transistor devices such as memory devices like Flash, EEPROMs, or other electronic devices, including CMOS and bipolar transistors, digital and analog circuits, thin film transistor, and electroluminescent displays.

These and other aspects, embodiments, advantages, and features will become apparent from the following description and the referenced drawings.

DETAILED DESCRIPTION

Figure 1:
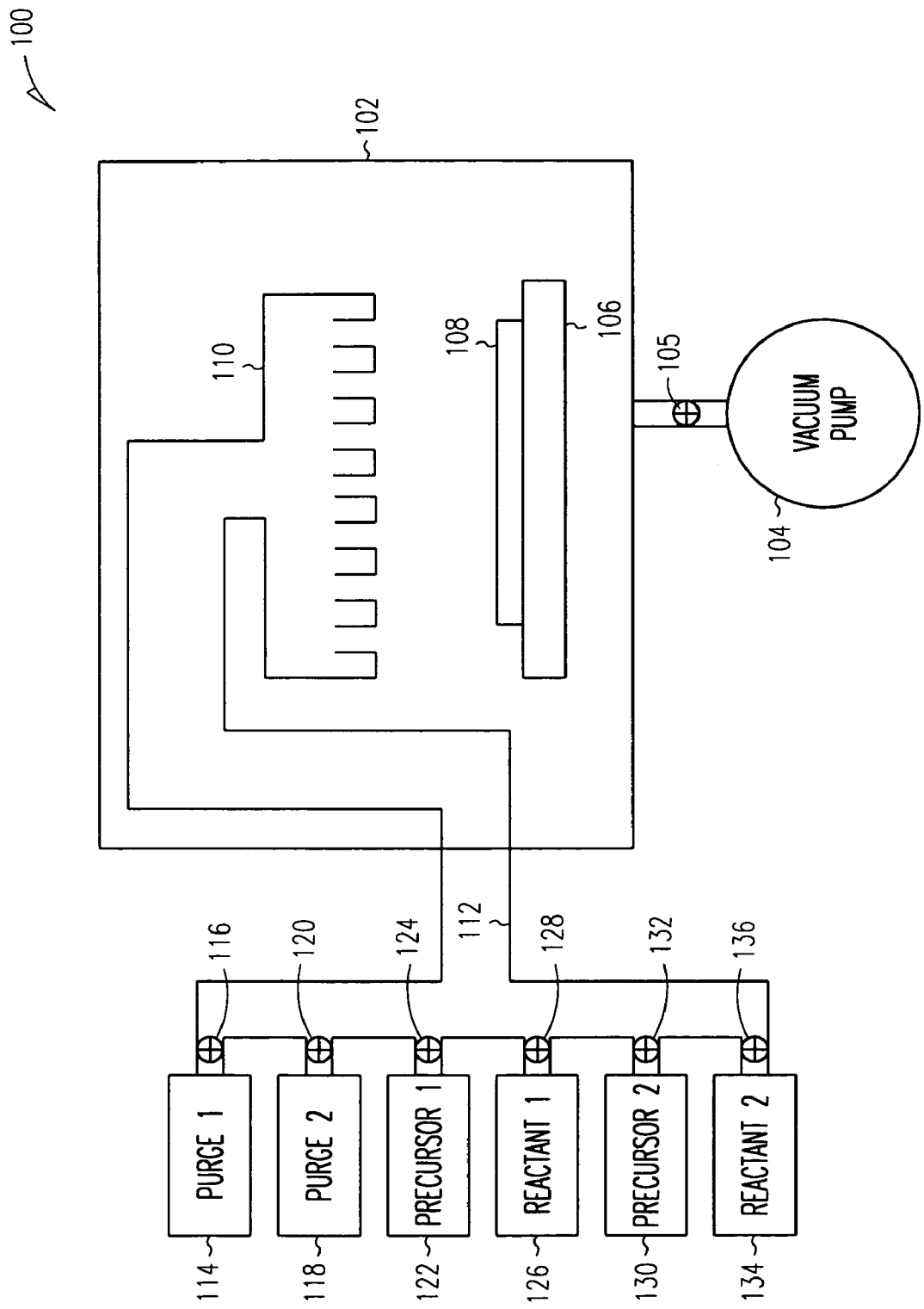
FIG. 1 illustrates an embodiment of an atomic layer deposition system for fabricating a titanium nitride layer formed as a sequence of titanium nitride layers.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors. The term step coverage is used to refer to the ratio of the minimum thickness of a material going over a horizontal to vertical transition to the thickness of the same material on a flat surface.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In an embodiment, a titanium nitride ($TiN_x$) film having a substantially smooth surface is formed using atomic layer deposition (ALD). Forming such a film using atomic layer deposition can provide for controlling transitions between material layers. As a result of such control, ALD TiN films may have an engineered transition with a substrate surface in a contact hole, and may be formed with many thin layers of continuously changing material composition to enable improved adhesion at one surface, and grading to increased electrical conductivity in the bulk of the $TiN_x$ material.

ALD, which may also be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated. The first precursor material be introduced may be called the precursor, and the next material introduced may be called the reactant, but both materials are precursors to the eventual material formed by the ALD reaction. If there are two precursors or two reactants that do not react with each other in the gas phase, then the ALD process may be modified to allow both precursors or reactants to flow simultaneously in to the reaction chamber.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor (referred to herein as the reactant) to the substrate where the growth reaction of the desired film takes place, with a reaction thickness that depends in part upon the amount of the chemisorbed first precursor. Subsequent to the film growth reaction, reaction byproducts and precursor excess are purged from the reaction chamber. With a precursor chemistry where the precursors adsorb and react with each other on the substrate aggressively, one ALD cycle can be performed in less than one second in properly designed flow type reaction chambers. Typically, precursor pulse times range from about 0.5 sec to about 10 seconds.

In ALD processes, the saturation of all the reaction and purging phases makes the film growth self-limiting. This self-limiting growth results in large area uniformity and conformality, which has important applications for such cases as planar substrates, deep trenches, or high aspect ratio contact holes, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. ALD has been studied for the growth of different epitaxial II-V and II-VI films, nonepitaxial crystalline or amorphous oxide and nitride films and multilayer structures of these. There also has been considerable interest in the ALD growth of silicon and germanium films, but due to the difficult precursor chemistry, this has not been very successful to date.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors may be used, though evaporation rates may somewhat vary during the process because of changes in surface area.

Other desirable characteristics for ALD precursors include thermal stability at the substrate temperature, since decomposition may destroy surface control (and accordingly one of the advantages of the ALD method), which relies on the reaction of the precursor at the substrate surface. A slight decomposition, if slow compared to the ALD growth, may be tolerated. The precursors should chemisorb on, or react with the surface, though the interaction between the precursor and the surface as well as the mechanism for the chemisorption (similar to adsorption) is different for different precursors. The molecules at the substrate surface should react aggressively with the second precursor, which may be called a reactant, to form the desired film. Additionally, precursors should not react with the film to cause etching, and precursors should not dissolve in the film. The ability to use highly reactive precursors in ALD processes may be contrasted with precursors for conventional metallo-organic CVD (MOCVD) type reactions. Further, the by-products of the reaction should be gaseous in order to allow their easy removal from the reaction chamber during a purge stage. Finally, the by-products should not react or adsorb on the substrate surface.

In a reaction sequence ALD (RS-ALD) process, the self-limiting process sequence involves sequential surface chemical reactions. ALD relies on chemistry between a reactive surface and a reactive molecular precursor. In an ALD process, molecular precursors are pulsed into the ALD reaction chamber separately, except in the case where two non inter reacting materials are used. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition thickness per cycle, composition, and thickness. ALD sequences generally deposit less than a full layer per cycle. Typically, a deposition or growth rate of about 0.25 to about 2.00 Å per ALD cycle may be realized.

The advantages of ALD include continuity at an interface or a topological step, and avoiding poorly defined nucleating regions, as are typical for thin chemical vapor deposition (<20 Å) and thin physical vapor deposition (<50 Å) cycles, conformality over a variety of substrate topologies due to its layer-by-layer deposition technique, use of low temperature, lack of dependence on the reaction chamber geometry, growth thickness dependent solely on the number of cycles performed, and ability to engineer multilayer laminate films with resolution of one to two monolayers. ALD processes allow for deposition control on the order of single monolayers and the ability to deposit monolayers of amorphous films.

A cycle of an ALD deposition sequence may include pulsing a precursor material such as TDEAT (or other thermally stable precursor) for 2 seconds, pulsing a purging gas for the precursor, such as argon for 2 seconds and pumping the system back to a base pressure for an illustrative 5 seconds, pulsing a reactant precursor, for example a mix of carbon monoxide and ammonia for 3 seconds, and pulsing the reactant's purging gas, for example argon for 2 seconds and pumping the system for 10 seconds. The ALD process depends on chemical absorption (chemisorbs) of the precursors and reactants on the surface, which is self limiting, thus resulting in a very consistent deposition thickness that depends upon the amount of the first precursor that adsorbs onto, and saturates, the surface. This cycle may be repeated until the desired thickness is achieved in a single material layer, or may be alternated with pulsing a third precursor material, pulsing a purging gas for the third precursor, pulsing a fourth reactant precursor, and pulsing the reactant's purging gas to form a second material layer upon the first material. There need not be a reactant gas if the precursor can interact with the substrate directly, as in the case of a dopant metal layer deposited upon a dielectric layer. In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of different materials having a thickness on the order of a nanometer, and each nanolayer may be a continuous film only a single monolayer thick of the material. The nanolayers are not limited to alternating single layers of each material, but may include having several layers of one material alternating with a single layer of the other material, to obtain a desired ratio of the two or more materials. The layers of different materials may remain separate after deposition, or they may react with each other to form an alloy layer. The alloy layer may be viewed as a doping layer, and the properties of the dielectric layer may be varied by such doping.

As previously noted, the overall titanium nitride layer may be varied monolayer by monolayer to improve the surface properties and interface to silicon substrates, to dielectric layers, or to other conductive layers. For simplicity, in the embodiments discussed herein, the $TiN_x$ layer will have a consistent composition throughout the entire layer, and X will equal one, that is, the titanium nitride will be have a composition of TiN.

In an embodiment, a layer of titanium nitride is formed on a substrate mounted in a reaction chamber using atomic layer deposition. An embodiment includes forming the titanium nitride layers using a precursor gas such as TDEAT (tetrakisdiethylamidotitanium), having a chemical formula of $Ti[(C_2H_5)_2N]_4$. The reactant precursor is a mixture of ammonia ($NH_3$) and carbon monoxide (CO). TDEAT is a liquid precursor that may be used in a bubbler at a temperature of about 100° C., using helium as the carrier gas.

The use of such precursors in an ALD reaction chamber may result in lower substrate deposition temperatures in the range of 200° C. to 450° C., and preferably in the area around 230° C. Purge gases used between precursor and reactant injection phases may include nitrogen, helium, argon or neon. The TiN films formed may have good thermal and electrical properties, with a high electrical conductivity of around 600 μohm-cm. The TiN films have good step coverage values of better than 80%, and high continuity with low pinhole values.

FIG. 1 shows an embodiment of an atomic layer deposition system 100 for forming a TiN film. The elements depicted permit general discussion of the principles of ALD depositions, and is useful in practicing the present subject matter. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. The illustrated mass flow controllers are combined with a control valve (not shown for simplicity) to provide a secure shut off position. Gas sources 122 or 130 may provide a precursor gas either by storing the precursor as a gas, or by providing for a heater to slowly evaporate a solid source, or a bubbler to entrain a liquid material, to form the selected precursor material. The bubbler may have a carrier gas bubbling through the liquid precursor, or may be passed over the surface of the liquid to transport evaporated vapor from the precursor liquid. The figure shows more than one precursor source, but the subject matter is not so limited, and in disclosed embodiments there is only a single precursor source used.

Also included in the system are purging gas sources 114 and 118, coupled to mass-flow controllers 116 and 120, respectively. The disclosed embodiments may use only one of the purge gases for all disclosed illustrative purging steps, or both purge gases may be used simultaneously, or alternately as required for the particular desired result. For a process that uses the same purging gas for multiple precursor gases fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases at the end of a purging sequence from reaction chamber 102. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other commercially available ALD systems may also be used.

The use and operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 may be controlled by a computer using a computer readable medium containing computer executable instructions to control the individual elements such as pressure, temperature, and gas flow within ALD system 100. To focus on the use of ALD system 100 in the various embodiments of the present invention, the computer is not shown, although those skilled in the art can appreciate that system 100 can be under computer control.

Figure 2:
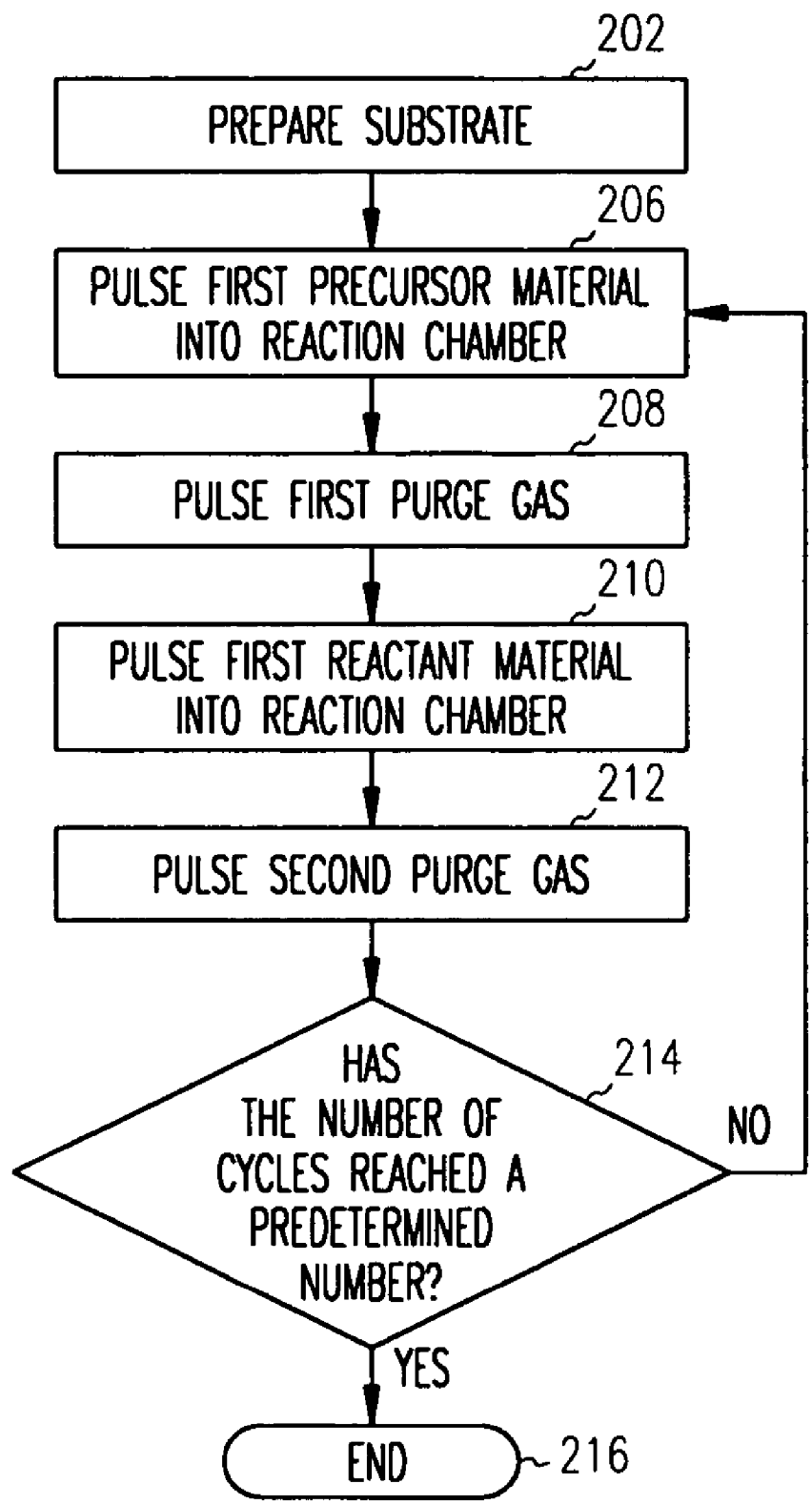
FIG. 2 illustrates a flow diagram of elements for an embodiment of a method to form a titanium nitride layer.

FIG. 2 illustrates a flow diagram of operational steps for an embodiment of a method to form a TiN layer. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102. At 206 a first precursor material enters the reaction chamber for a predetermined length of time, for example 0.5-2.0 seconds. The first precursor material is chemically adsorbed onto the surface of the substrate, the amount depending upon the temperature of the substrate, in one embodiment 230° C., and in the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface. An embodiment has a precursor gas including TDEAT.

At 208 a first purge gas enters the reaction chamber for a predetermined length of time sufficient to remove substantially all of the non-chemisorbed first precursor material. Typical times may be 1.0-2.0 seconds with a purge gas comprising nitrogen, argon, neon, combinations thereof, or other gases such as hydrogen. At 210 a first reactant gas enters the chamber for a predetermined length of time, sufficient to provide enough of the reactant to chemically combine with the amount of chemisorbed first precursor material on the surface of the substrate. In an embodiment, reactant materials include ammonia and carbon monoxide, either pulse simultaneously, sequentially, or in alternating cycles. At 212 a second purge gas, which may be the same or different from the first purge gas, enters the chamber for a predetermined length of time, sufficient to remove substantially all non-reacted materials and any reaction byproducts from the chamber. Although the described embodiment includes two different purge operations, the invention is not so limited. There may be a single continuous or variable purge, or there may be no purge gas at all, with the reactant materials being removed only by a pump mechanism. Alternatively, the removal of the reactants and reaction products may occur by a purge gas flow alone.

At 214 a decision is made as to whether or not the thickness of the first dielectric material in the dielectric has reached the desired thickness, or whether another deposition cycle is required. If another deposition cycle is needed, then the operation returns to 206, until the desired first dielectric layer is completed, at which time the process moves on to the end of deposition process at 216.

Figure 3:
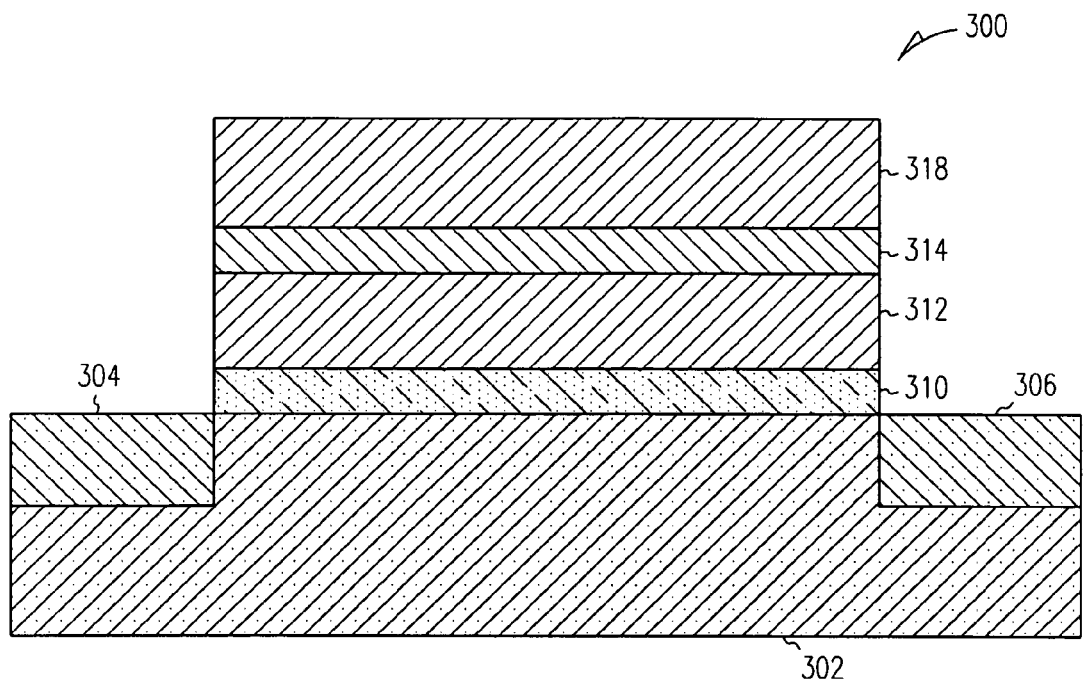
FIG. 3 illustrates an embodiment of a configuration of a transistor having a titanium nitride layer deposited by atomic layer deposition on a polysilicon gate and under a different conductive material.

FIG. 3 illustrates a single transistor in an embodiment of a method to form a conductive TiN layer formed of a plurality of ALD deposited titanium nitride layers. This embodiment may be implemented with the system 100 of FIG. 1 used as an atomic layer deposition system. A substrate 302 is prepared, typically a silicon or silicon containing material. In other embodiments, germanium, gallium arsenide, silicon-on-sapphire substrates, or other suitable substrates may also be used. The preparation process may include cleaning substrate 302 and forming various layers and regions of the substrate, such as source-drain diffusion 304 and source-drain diffusion 306 of an illustrative metal oxide semiconductor (MOS) transistor 300. The sequencing of the formation of the regions of the transistor 300 being processed may follow the generally understood fabrication of a MOS transistor as is well known to those skilled in the art.

The dielectric 310 covering the area on the substrate 302 between the source and drain diffused regions 304 and 306 may known as a gate oxide layers. Covering the gate oxide 310 is the gate electrode 312, which may be formed of conductive polycrystalline silicon (polysilicon) or various metals, depending upon the desired transistor 300 threshold voltage. Covering the gate electrode 312 is an ALD deposited conductive TiN layer 314, which is covered by metal layer 318, typically an aluminum alloy or copper. The TiN layer 314 may be used as a diffusion barrier layer to prevent metal from layer 318 from affecting the electrical properties of the transistor device 300 by diffusing through the poly gate 312 and the gate oxide 310 and contaminating the substrate 302 with metal.

Embodiments of methods for forming conductive TiN layers formed by an ALD deposition may also be applied to forming metal plates in capacitors, in forming conductive traces in various integrated circuits, memory devices, and electronic systems.

Figure 4:
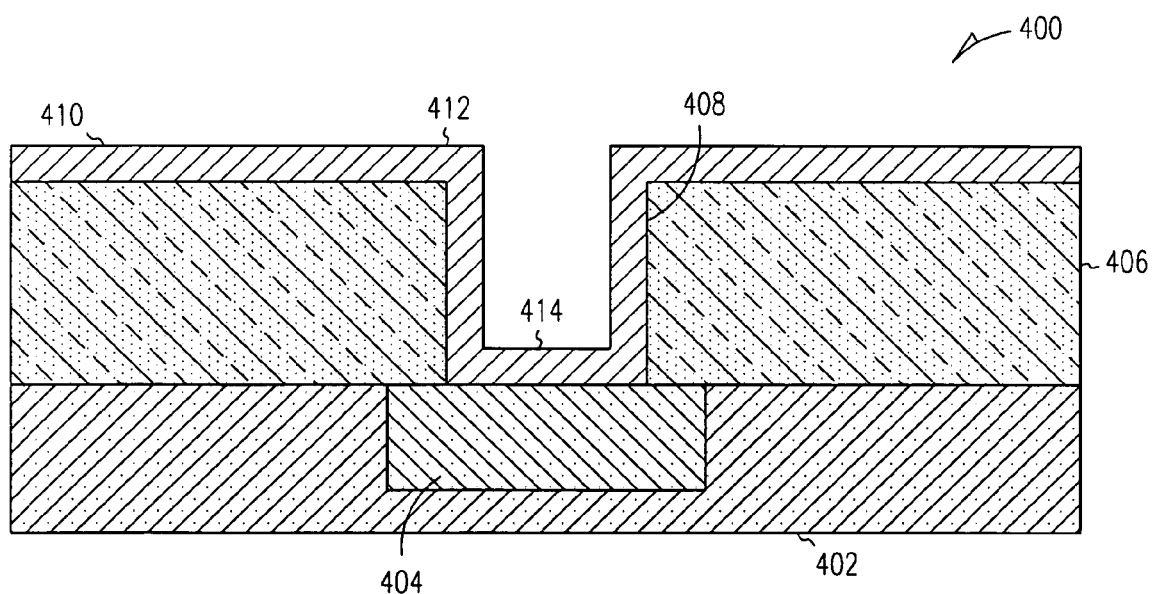
FIG. 4 shows an embodiment of a contact in a dielectric layer having an atomic layer deposited titanium nitride layer.

FIG. 4 illustrate a contact hole having a conductive TiN layer providing at least a portion of the electrical signal conduction to a diffused structure. A conductive filled contact 400 has a substrate 402, typically a semiconductor such as silicon, with a diffused structure 404, such as a diode or a source/drain region formed in the substrate. A dielectric layer, such as silicon oxide layer 406, will have a hole, or contact 408 formed through the dielectric 406 to contact the diffused region 404. An ALD deposited layer of conductive TiN 410 traverses the flat top portion of the dielectric layer 406 and has a first thickness $t_1$. The TiN layer 410 also traverses the edge of the contact 408 at location 412 and covers the sidewalls and the bottom 414 of contact 408. The illustrative embodiment of an ALD deposited TiN layer will have a minimum thickness at the either the top corner at 412, on the sidewall at 408 or at the inside corner of the bottom 414 of the contact. The TiN layer 410 will have a ratio of the thinnest portion to the thickness at the flat top portion 410 that will be greater than 80%. This is known as having a step coverage of 80%. The TiN layer 410 is shown as being a single layer, but the subject matter is not so limited, and typically the TiN layer 410 would have a thickness of from 50 to 200 Angstroms, and be formed of from 100 to 400 individual layer of TiN, each layer formed in one ALD cycle. The individual layers may have a graded composition, or they may have an identical composition. TiN layer 410 may be covered by another metal layer, such as aluminum.

Structures such as shown in FIGS. 3 and 4 may be used in any integrated circuit or transistor devices, such as flash memory devices as well as other memory, logic or information handling devices and systems. Embodiments of these information handling devices include wireless systems, telecommunication systems, computers and integrated circuits.

Figure 5:
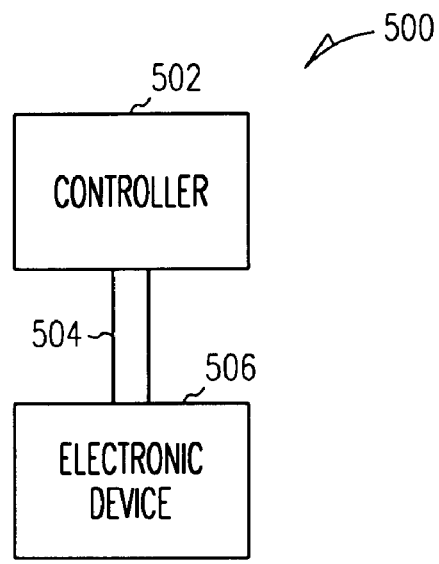
FIG. 5 is a simplified diagram for an embodiment of a controller coupled to an electronic device.

FIG. 5 illustrates a diagram for an electronic system 500 having one or more devices having atomic layer deposited TiN layers formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for an ALD conductive TiN layer as previously discussed herein. Electronic system 500 may include, but is not limited to, information handling devices, wireless systems, telecommunication systems, fiber optic systems, electro-optic systems, and computers.

Figure 6:
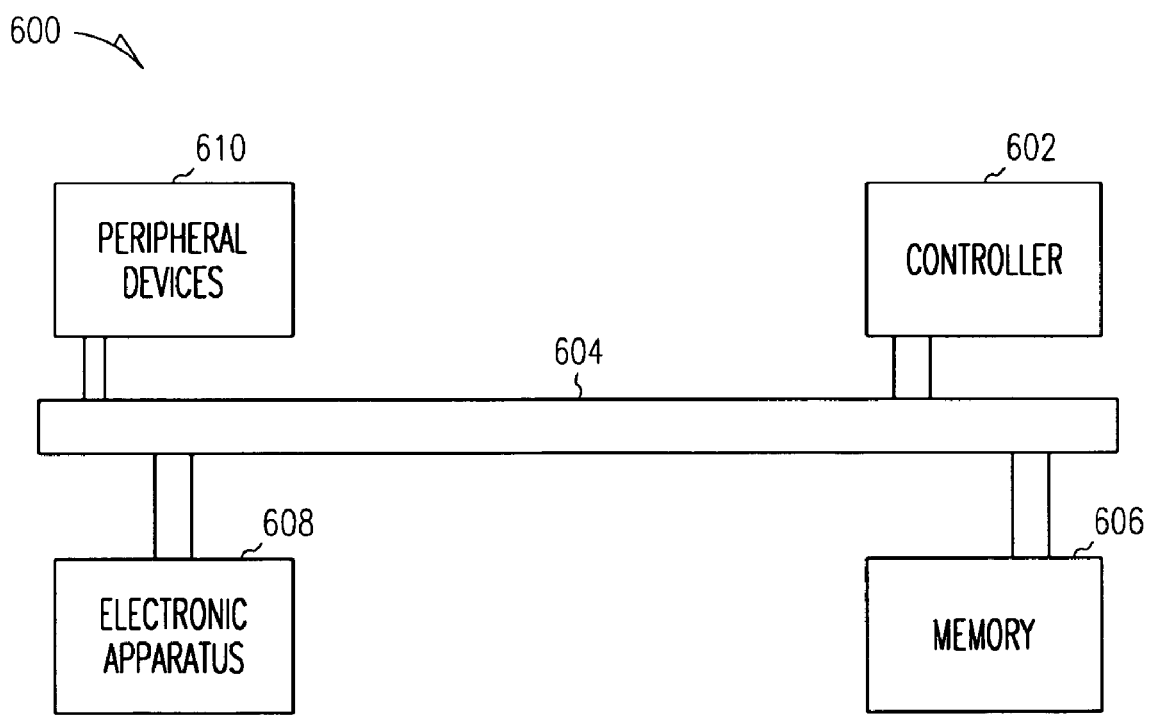
FIG. 6 illustrates a diagram for an embodiment of an electronic system having devices.

FIG. 6 depicts a diagram of an embodiment of a system 600 having a controller 602 and a memory 606. Controller 602 and/or memory 606 includes a ALD TiN conductive layer. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a signal conductor layer having an ALD deposited TiN layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include DRAM, SRAM (Static Random Access Memory) or Flash memories.

TiN conductive layers formed by ALD using the TDEAT precursor and the 1 to 7 mixture of ammonia and carbon monoxide have resistivity in the range of 600 to 800 μohm-cm, as compared to 6,000 μohm-cm with previous deposition methods, and have step coverage of greater than 80%, as compared to less than 60% with previous deposition methods. Deposition rates are in the same range as previous deposition methods, and the thickness control and standard deviation of film thickness variation are also the same, resulting in an improved process that continues to possess manufacturing robustness.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention, including TiN layers with graded compositions. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of forming a plurality of individual titanium nitride mono layers, each individual titanium nitride mono layer including at least one surface in direct contact with at least one other individual titanium nitride mono layer on a substrate by atomic layer deposition, the method of forming titanium nitride comprising:
    exposing the substrate to at least one precursor containing titanium; and
    exposing the substrate to at least one reactant containing nitrogen and at least one reactant containing no nitrogen.

2. The method of claim 1, wherein a temperature of the substrate is in a range of approximately 150° C. to 370° C.

3. The method of claim 2, wherein the temperature of the substrate is approximately 230° C.

4. The method of claim 1, wherein the at least one precursor includes tetrakisdiethylamidotitanium.

5. The method of claim 4, wherein the precursor is a liquid having a temperature between 85° C. and 115° C., and an inert carrier gas having a flow of from 50 sccm to 150 sccm is passed into the precursor.

6. The method of claim 1, wherein at least one of the reactants includes a reducing agent.

7. The method of claim 1, wherein the at least one reactant containing nitrogen includes ammonia ($NH_3$).

8. The method of claim 1, wherein the at least one reactant containing no nitrogen includes carbon monoxide (CO).

9. The method of claim 1, wherein exposing the substrate to the reactant containing nitrogen and the reactant containing no nitrogen occurs substantially simultaneously.

10. The method of claim 1, wherein the at least one precursor includes tetrakisdiethylamidotitanium, the at least one reactant containing nitrogen includes ammonia ($NH_3$), and the at least one reactant containing no nitrogen includes carbon monoxide (CO).

11. A method of forming a titanium nitride layer on a substrate by atomic layer deposition, the method of forming titanium nitride comprising:
    exposing the substrate to at least one precursor chemical containing titanium;
    exposing the substrate to a first non-reactive purge gas flow;
    exposing the substrate to at least one reactant gas containing nitrogen and at least one reactant gas not containing nitrogen;
    exposing the substrate to a second non-reactive purge gas flow;
    wherein the titanium nitride layer has a first thickness; and
    repeating until a plurality of titanium nitride layers having a predetermined final thickness is achieved, wherein each of the plurality of titanium nitride layers is in contact with at least one other one of the plurality of titanium nitride layers.

12. The method of claim 11, wherein the first thickness is in a range from 0.5 angstroms to 1.5 angstroms.

13. The method of claim 11, wherein the final thickness is an integral number of times thicker than the first thickness.

14. The method of claim 11, wherein the first and second non-reactive purge gases are the same.

15. The method of claim 14, wherein the purge gas is argon.

16. The method of claim 11, wherein the at least one reactant gas containing nitrogen comprises ammonia ($NH_3$).

17. The method of claim 16, wherein carbon monoxide (CO) is present at substantially the same time as the ammonia ($NH_3$).

18. The method of claim 17, wherein a volume of the CO is seven times a volume of the $NH_3$.

19. The method of claim 17, wherein a volume of the CO is about 3500 sccm and a volume of the $NH_3$ is about 500 sccm.

20. The method of claim 19, wherein a temperature of the substrate is in a range of approximately 150° C. to 370° C., and the precursor chemical containing titanium comprises tetrakisdiethylamidotitanium.

21. A method of forming a titanium nitride layer, the method of forming titanium nitride comprising:
    exposing an activated substrate surface at a preselected temperature to a titanium-containing precursor material for a preselected first time period and a preselected flow volume of the precursor material to saturate the substrate surface with the precursor material;
    exposing the substrate surface to a preselected volume of a first purge material for a preselected second time period to remove substantially all of a non-adsorbed portion of the precursor material from the substrate surface;
    exposing the substrate surface to a reactant mixture having at least a nitrogen containing reactant and a non nitrogen containing reactant for a preselected third time period to react with the adsorbed portion of the precursor material on the substrate surface to form a layer of a titanium nitride material having a first intermediate thickness to complete a first deposition cycle;
    exposing the substrate surface to a preselected volume of a second purge material for a preselected fourth time period to remove substantially all of a non-reacted portion of the reactant material, and a first plurality of gaseous reaction byproducts from the substrate surface; and
    repeating the first deposition cycle until a plurality of titanium nitride layers having a preselected final titanium nitride thickness is obtained.

22. The method of claim 21, wherein the nitrogen containing reactant material comprises a mixture of carbon monoxide (CO) and ammonia ($NH_3$).

23. The method of claim 22, wherein the CO has a volume that is approximately seven times a volume of the $NH_3$.

24. The method of claim 21, wherein the activated substrate surface is formed by a sputter etch process in a same chamber as used in the forming the titanium nitride.

25. The method of claim 21, wherein the first and second purge materials are chemically inert gases.

26. The method of claim 25, wherein the first and second purge materials comprise argon.

27. The method of claim 21, wherein the preselected temperature is in a range of approximately 150° C. to 370° C., and the titanium-containing precursor material comprises tetrakisdiethylamidotitanium.

28. The method of claim 21, wherein the titanium nitride layer has a chemical formula of $TiN_x$, where $0.5<X<2.0$, and a resistivity of less than 800 μohm-cm.

29. The method of claim 21, wherein the titanium nitride layer has a step coverage of greater than 75% over topographical steps of the substrate.

30. A method of forming a titanium nitride layer on a substrate by atomic layer deposition, the method of forming titanium nitride comprising:
    exposing the substrate to at least one precursor containing titanium;
    exposing the substrate to a mixture of a reactant containing nitrogen and a reactant containing no nitrogen; and
    forming an electrically conductive layer on the titanium nitride layer.

31. The method of claim 30, wherein the substrate includes a conductive layer disposed below the titanium nitride layer.

32. The method of claim 31, wherein the method is a method of forming at least one conductive plate on a capacitive device.

33. The method of claim 31, wherein the method is a method of forming a conductive signal line on a transistor device.

34. The method of claim 33, wherein the method is a method of forming a memory device.

35. The method of claim 30, wherein the titanium nitride layer is formed by a plurality of atomic layer deposition cycles, each atomic layer deposition cycle forming a continuous monolayer of titanium nitride approximately 0.1 nm in thickness.

36. The method of claim 30, wherein the mixture of a reactant containing nitrogen and a reactant containing no nitrogen has a ratio value of from 0.2 to 0.1, and comprises a mixture of ammonia ($NH_3$) and carbon monoxide (CO).

37. The method of claim 30, wherein the precursor containing titanium comprises tetrakisdiethylamidotitanium.

38. The method of claim 30, wherein the substrate is at a temperature of between 150° C. to 350° C.

39. A method of forming a titanium nitride layer on a substrate by atomic layer deposition, the method of forming titanium nitride comprising:
    exposing the substrate to at least one precursor containing titanium; and
    exposing the substrate to at least one reactant containing no nitrogen.

40. The method of claim 39, wherein a temperature of the substrate is in a range of approximately 150° C. to 370° C.

41. The method of claim 40, wherein the temperature of the substrate is approximately 230° C.

42. The method of claim 39, wherein the at least one precursor includes tetrakisdiethylamidotitanium.

43. The method of claim 42, wherein the precursor is a liquid having a temperature between 85° C. and 115° C., and an inert carrier gas having a flow of from 50 sccm to 150 sccm is passed into the precursor.

44. The method of claim 39, wherein at least one of the reactants includes a reducing agent.

45. The method of claim 39, wherein the at least one reactant containing no nitrogen includes carbon monoxide (CO).

* * * * *